United States Patent
Choi et al.

(10) Patent No.: US 11,143,670 B2
(45) Date of Patent: Oct. 12, 2021

(54) SENSING AN ICMFB OUTPUT TO DETECT FUNCTIONAL STATE OF A MEMS SENSOR

(71) Applicant: STMicroelectronics, Inc., Coppell, TX (US)

(72) Inventors: Davy Choi, Carrollton, TX (US); Yamu Hu, Allen, TX (US); Deyou Fang, Frisco, TX (US)

(73) Assignee: STMICROELECTRONICS, INC., Coppell, TX (US)

( * ) Notice: Subject to any disclaimer, the term of this patent is extended or adjusted under 35 U.S.C. 154(b) by 884 days.

(21) Appl. No.: 15/599,234

(22) Filed: May 18, 2017

(65) Prior Publication Data

US 2018/0335446 A1 Nov. 22, 2018

(51) Int. Cl.
*G01P 21/00* (2006.01)
*G01P 15/125* (2006.01)
*G01R 19/10* (2006.01)
*G01R 31/28* (2006.01)

(52) U.S. Cl.
CPC ............ *G01P 21/00* (2013.01); *G01P 15/125* (2013.01); *G01R 19/10* (2013.01); *G01R 31/2829* (2013.01)

(58) Field of Classification Search
CPC ................................ G01P 21/00; G01P 15/125
USPC ........................................................ 73/1.38
See application file for complete search history.

(56) References Cited

U.S. PATENT DOCUMENTS

2011/0241780 A1* 10/2011 Honda ................ H03F 3/45183
330/260

OTHER PUBLICATIONS

Bachirotto, A., et al., "A +/-1-g Dual-Axis Linear Accelerometer in a Standard 0.5-um CMOS Technology for High-Sensitivity Applications," IEEE Journal of Solid-State Circuits, vol. 38, No. 7, Jul. 2003, pp. 1292-1297.
Lemkin, M. et al., "A Three-Axis Micromachined Accelerometer with a CMOS Position-Sense Interface and Digital Offset-Trim Electronics," IEEE Journal of Solid-State Circuits, vol. 34, No. 4, Apr. 1999, pp. 456-468.

* cited by examiner

*Primary Examiner* — John Fitzgerald
*Assistant Examiner* — Rodney T Frank
(74) *Attorney, Agent, or Firm* — Slater Matsil, LLP

(57) ABSTRACT

In one embodiment, a method for detecting functional state of a microelectromechanical (MEMS) sensor is described. The method includes monitoring an input common-mode feedback (ICMFB) voltage generated by an ICMFB circuit coupled to the MEMS sensor through a plurality of nodes. The method also includes determining, using the monitored ICMFB voltage, whether all of the plurality of nodes of the MEMS sensor are electrically connected to the ICMFB circuit.

9 Claims, 6 Drawing Sheets

| SWITCH | MODE1 | MODE2 | MODE3 |
|---|---|---|---|
| swA | φ1 | φ2 | φ2 |
| swB | φ2 | φ1 | φ1 |
| swC | ON | ON | OFF |
| swD | OFF | OFF | ON |
| swE | OFF | OFF | ON |
| swF | ON | ON | OFF |

*Fig. 3*

SENSING AN ICMFB OUTPUT TO DETECT FUNCTIONAL STATE OF A MEMS SENSOR

TECHNICAL FIELD

The present invention relates generally to microelectromechanical systems (MEMS) sensors, and, in particular embodiments, to a system and method for sensing an input common-mode feedback (ICMFB) output to detect functional state of a MEMS sensor.

BACKGROUND

A capacitive MEMS accelerometer sensor includes two STATOR nodes and one ROTOR node. In a typical system, the three MEMS sensor nodes are coupled to an application specific integrated circuit (ASIC).

The acceleration of the MEMS sensor, due to an external force, displaces an internal suspended proof mass. The displacement of the proof mass with respect to a pair of stationary electrodes results in a temporary variation in the capacitance between the materials. The ASIC monitors the change in capacitance to determine an approximate calibrated system acceleration.

In some instances, when one or more nodes of the MEMS sensor are disconnected from the ASIC, the analog-to-digital converter (ADC) in the ASIC saturates and the approximate calibrated acceleration value resembles the systems most extreme conditions. The system may then categorize these extreme values as system faults related to a functional disconnect at the MEMS sensor. In other instances, the disconnect between the ASIC and MEMS sensor may fall within reasonable system conditions. Therefore, the ASIC is unable to, without errors, differentiate a functional disconnect.

SUMMARY

In accordance with an embodiment, a method for detecting functional state of a microelectromechanical (MEMS) sensor includes monitoring an input common-mode feedback (ICMFB) voltage generated by an ICMFB circuit coupled to the MEMS sensor through a plurality of nodes. The method includes determining, using the monitored ICMFB voltage, whether all of the plurality of nodes of the MEMS sensor are electrically connected to the ICMFB circuit.

In accordance with another embodiment, an application specific integrated circuit (ASIC) is coupled to a microelectromechanical (MEMS) sensor. The ASIC is configured to determine a functional state of the MEMS sensor corresponding to an output voltage of the ICMFB circuit.

In accordance with another embodiment, a device includes a microelectromechanical (MEMS) sensor. The device includes an application specific integrated circuit (ASIC) including an input common-mode feedback (ICMFB) circuit coupled to the MEMS sensor. The ASIC is configured to determine a functional state of the MEMS sensor corresponding to an output voltage of the ICMFB circuit.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a table of three operational modes of a system for detecting functional state of a MEMS sensor;

DETAILED DESCRIPTION OF ILLUSTRATIVE EMBODIMENTS

Figure 1:
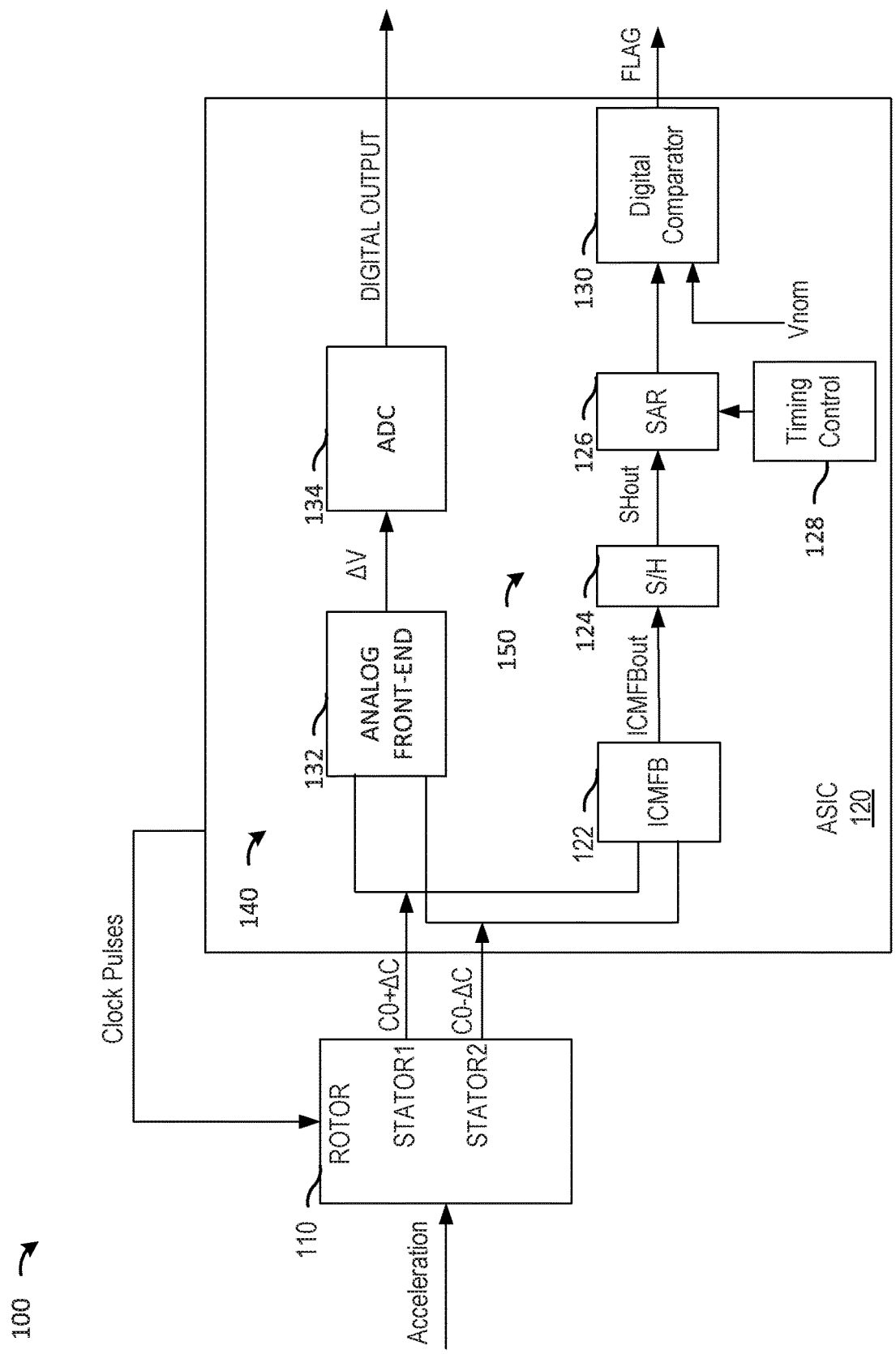
FIG. 1 is a block diagram of a system for detecting functional state of a microelectromechanical systems (MEMS) accelerometer sensor.

The structure, manufacture, and use of embodiments are discussed in detail below. It should be appreciated, however, that this disclosure provides many applicable inventive concepts that can be embodied in a wide variety of specific contexts. The specific embodiments discussed are merely illustrative of specific ways to make and use the invention, and do not limit the scope of the invention.

In this disclosure, methods are presented that determine whether or not all of the terminals of a MEMS sensor are functionally connected to a front-end circuit by monitoring the output voltage of an input common-mode feedback (ICMFB) circuit. In embodiments in which the capacitance of the MEMS sensor forms the input capacitance of a switched-capacitor integrator of a sigma-delta (ΣΔ) modulator, the difference between the output voltage over successive cycles is monitored and compared to a threshold to determine the quality of the functional connection of the MEMS sensor to improve system reliability and safety within existing system capabilities.

Microelectromechanical systems (MEMS) are microscopic devices typically with moving pails. MEMS gyroscopes, MEMS pressures sensors, and MEMS accelerometers are some commercial examples that employ MEMS technology. Vehicles have employed MEMS accelerometers for a number of purposes such as, but not limited to, electronic stability control, navigation control, mechanical fault detection, or airbag deployment.

As an example, a vehicle accelerometer may detect a rapid negative deceleration to determine an occurrence and severity of a crash. The vehicle may then deploy a system of responses corresponding to the rate of the negative deceleration. In the case of a severe deceleration, in addition to employing the input from other sensors, the vehicle may deploy the airbags, apply the brakes, or shut off the engine.

In another example, the measurement of lateral acceleration by the accelerometer may be used to help improve vehicle stability. A vehicle may apply an electronic stability control (ESC) to monitor a variety of sensors, such as an accelerometer, to detect sliding of the vehicle. The computerized control system of the ESC may recognize the discrepancy between an intended motion and the measured motion. The vehicle may then correct for oversteering, by applying the brakes or reducing power at the engine, to prevent the vehicle from rolling over or spinning out of control.

Generally, a MEMS accelerometer detects a displacement of a suspended proof mass attached to a reference frame using a mechanical suspension system. Positioned between the suspended proof mass and a pair of stationary electrodes are two nominally equal-sized common-mode sense capacitors (Co). An analog-to-digital converter (ADC) converts the analog acceleration to a digital representative acceleration value. In some systems, a sigma-delta (ΣΔ) feedback loop may be used to provide a balancing force to re-center the proof mass back to its nominal position. The ΣΔ feedback loop functionality is optional and may be removed from the system.

Acceleration at the MEMS sensor displaces the suspended proof mass from nominal position, resulting in an imbalance at the common-mode sense capacitors. This imbalance may be measured by a differential capacitance measurement, wherein an application specific integrated circuit (ASIC) applies a voltage pulse (VROT) to the ROTOR node coupled to the proof mass. The opposite nodes of the common-mode sense capacitors (STATOR1 and STATOR2) are separately coupled to the ASIC. The change in capacitance creates a corresponding change in voltage, which is amplified and/or digitized by the ASIC. The system translates the change in the sensor output to a calibrated value representing the proof mass movement, and therefore the applied acceleration.

As previously mentioned, the MEMS sensor may be disconnected from the ASIC at one or more of its ROTOR or STATOR nodes. Typically, if one STATOR node becomes open (i.e., detached from the ASIC) or tied to ground (i.e., accidental short due to soldering or other conditions), the ADC output may saturate. The digital output bits when the ADC is saturated may shift to an all binary value of all 1's or 0's. Therefore, the system may detect the ADC saturation by digitally comparing the digital output to a high or low threshold value. As an example, if the digital output is greater than 90% of full-scale range (FSR), then a flag can be set to indicate a fault condition. Alternatively, or additionally, the system may set an indicating flag when the digital output is less than 10% of FSR.

In an alternative case where both STATOR nodes are open, the digital output may yield a mid-code value (i.e., 1010 . . . ). Since the mid-code value is a valid code, corresponding to a o-g input acceleration, the system may not be able to detect the fault condition while monitoring the ADC output.

Similarly, in an event where the ROTOR node is open or, otherwise, shorted to ground, the digital output may again present a valid mid-code value corresponding to a o-g input acceleration. In such circumstances, the system is also unaware of a sensor fault.

The above discussed disconnect or fault between the MEMS sensor and the ASIC may be the result of one or more of a damaged MEMS sensor node (ROTOR or STATOR), damaged path between the ASIC and the MEMS sensor, a damaged node at the ASIC, or the like. For example, one or more leads of the MEMS sensor and/or the ASIC may be physically broken, the solder joints made by the MEMS sensor/ASIC may be physically damaged. Accordingly, electrical connection between the MEMS sensor and the ASIC is partially disrupted.

In an embodiment, the ASIC and the MEMS sensor each have a package and corresponding input and output nodes. The MEMS sensor may be mounted, or arranged in a location near the ASIC. The nodes of the MEMS sensor and the ASIC may be connected by a process of a wire bond, a ribbon bond, a solder or a like. As an example, as a result of vibrations in a vehicle, the integrity of the connection between the ASIC and the MEMS sensor may be compromised and one or more of the nodes of the MEMS sensor may be disconnected from the ASIC.

As proper vehicle control and vehicle safety in most modern cars is dependent, to a large extent to the presence and accurate functioning of sensors, the embodiments of this disclosure present methods to detect this type of fault condition in the operational field.

In an embodiment, a circuit, that includes the MEMS accelerometer sensor and an ASIC, is configured in a test operating mode. The ASIC determines a functional state of the MEMS accelerometer sensor by monitoring the output voltage of the ICMFB circuit. A previously defined ICMFB output voltage corresponding to a known good state of the MEMS accelerometer sensor is recalled from memory. If the difference between the output voltage of the ICMFB circuit in the test mode and the value stored in memory exceeds a predetermined threshold voltage, the ASIC may indicate a fault condition in the MEMS sensor accelerometer.

In another embodiment, a circuit, that includes the MEMS accelerometer sensor and an ASIC, is configured in a first test operating mode. The ASIC measures a first output voltage corresponding to a functional state of the MEMS accelerometer sensor at the first operating mode. At a different cycle, the circuit is configured in a second test operating mode. The ASIC measures a second output voltage corresponding to the functional state of the MEMS accelerometer sensor at the second test operating mode. A previously defined ICMFB output voltage corresponding to a known good state of the MEMS accelerometer sensor is recalled from memory. If the difference between the output voltage of the ICMFB circuit stored in memory and the differential between the first and second output voltages, corresponding to the two test operating modes, exceeds a predetermined threshold voltage, the ASIC may indicate a fault condition in the MEMS sensor accelerometer.

In yet another embodiment, a circuit, that includes the MEMS accelerometer sensor, and an ASIC, is configured in a first and second operating modes that are of reverse cycle of each other. The output voltage of the ICMFB circuit is sampled at the first operating mode and separately at the second operating mode. The difference between the two output voltages at the two cycles is captured at the SAR during the hold time. This measurement is first computed in a known good condition of the circuit and stored in memory. A similar measurement is periodically performed prior to the operation of the MEMS sensor and compared with the value stored in memory. If the comparison exceeds a predetermined threshold voltage, the ASIC may indicate a fault condition in the MEMS sensor accelerometer.

A detailed description of an embodiment of a system including a MEMS sensor that implements a method to detect a functional state of the MEMS sensor and output a digital representation of the acceleration will be provided using FIG. 1. A schematic diagram of an embodiment of an accelerometer system will be described using FIG. 2. Operational modes of the many possible modes of operation of the accelerometer system in FIG. 2 will be described using FIG. 3. A schematic diagram of an embodiment of the ICMFB circuit, as an example for the ICMFB circuit in FIG. 2 and the ICMFB circuit in FIG. 1 will be described using FIG. 4. A sample and hold (S/H) circuit as illustrated in FIG. 1 will be described using FIG. 5. A timing diagram of an embodiment as an example of the operational flow of the S/H circuit as illustrated in FIG. 5 will be described using FIG. 6.

FIG. 1 illustrates an embodiment of a system 100, including a MEMS sensor no that implements a method to detect a functional state of the MEMS sensor and output a digital representation of the acceleration.

An acceleration at the MEMS sensor no displaces a proof mass in the MEMS sensor no, causing a change in the MEMS sensor no output capacitance. The MEMS sensor no is coupled to an ASIC 120 through a ROTOR node and two STATOR nodes (STATOR1 AND STATOR2). The ASIC 120 applies a voltage pulse at the ROTOR node of the MEMS sensor 110.

The ASIC 120 includes an input common-mode feedback (ICMFB) circuit 122, a sample and hold (S/H) circuit 124, a successive approximation register (SAR) 126, a timing control circuit 128, a digital comparator 130, an analog front-end (AFE) 132, and an analog-to-digital converter (ADC) 134. The SAR 126 converts an analog signal to a digital representation using a successive approximation method. The digital comparator 130, compares two values (Vnom and the output of the SAR 126) and generates a flag in an instance where the two values do not match. Although the output voltage of the ICMFB circuit 122 (ICMFBout) may remain unchanged over various cycles of operation, the system 100 may capture and digitize the ICMFBout voltage over a plurality of cycles, to obtain an average measurement and reduce measurement errors.

In the embodiment, an accelerometer system 140 includes the MEMS sensor no, ICMFB circuit 122, AFE 132, and ADC 134 determine the MEMS sensor no acceleration. Separately, a fault detection system 150 including the MEMS sensor no, ICMFB circuit 122, S/H circuit 124, SAR 126, timing control circuit 128, and the digital comparator 130 determine a fault condition in the MEMS sensor no. The STATOR1 and STATOR2 nodes represent the sensed acceleration as a fully differential signal. Hence the ICMFB circuit 122 ensures that the common-mode voltage of STATOR1 and STATOR2 is maintained at a voltage that is compatible with the input compliance range of the AFE 132. Embodiments of the present invention use an internal signal from the feedback loop formed by the MEMS sensor no, the AFE 132, and the ICMFB circuit 122 to determine whether a MEMS sensor is connected.

Figure 2:
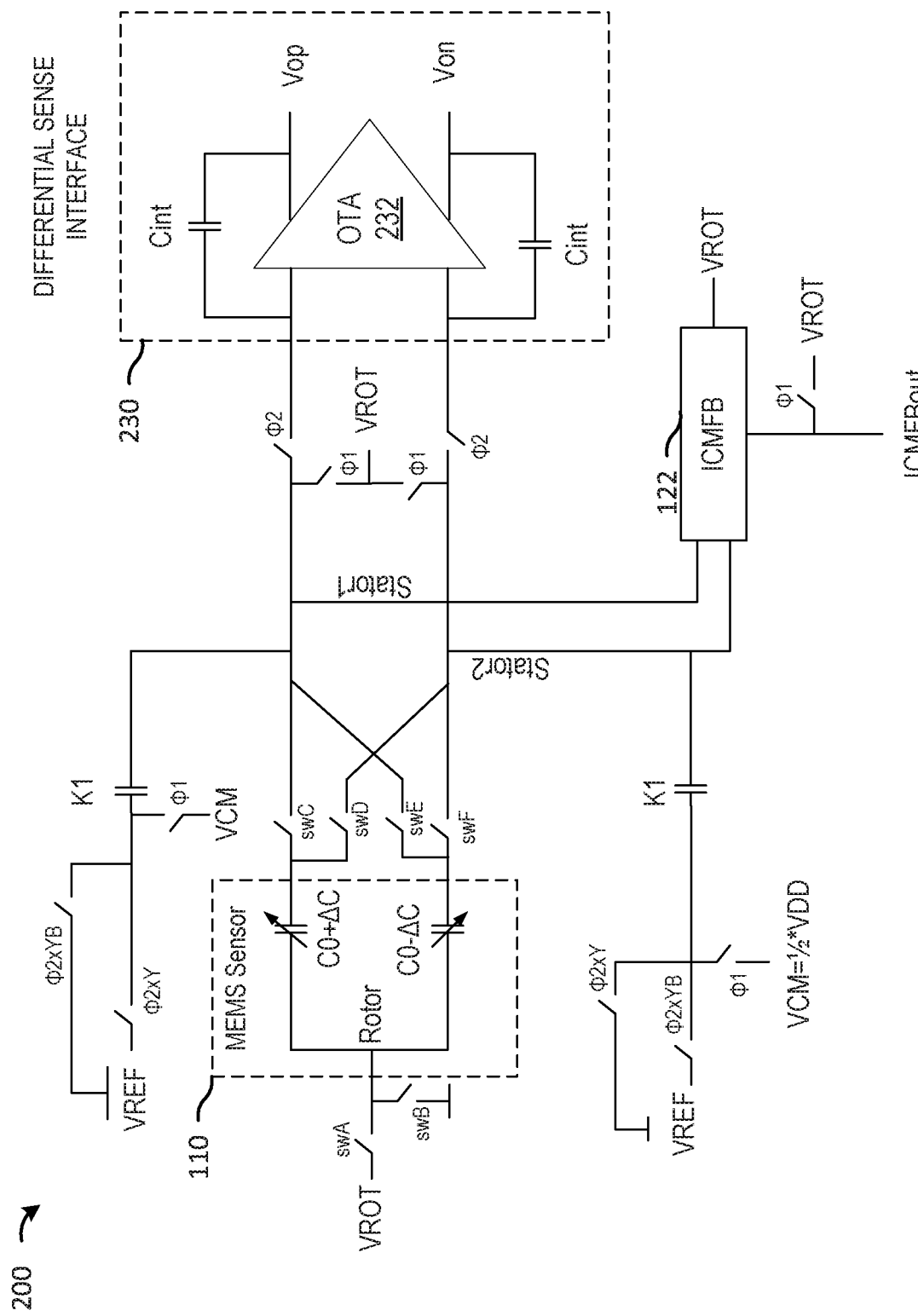
FIG. 2 is a diagram of a system illustrating a configuration for detecting functional state of a MEMS sensor in an existing accelerometer system.

In the accelerometer system 140, the change in capacitance at the MEMS sensor no is sensed at the AFE 132, for example, by measuring a voltage difference. In the embodiment of FIG. 2, the MEMS sensor capacitance is used as the input capacitor of a switched capacitor integrator. Essentially, the front-end is measuring and integrating differential changes stored in the MEMS sensor capacitance. The AFE 132 converts the sensor output capacitance from the MEMS sensor no to an analog voltage. The ADC 134 subsequently converts the analog voltage to a calibrated representation of the acceleration of the MEMS sensor 110.

In the fault detection system 150, the output voltage of the ICMFB circuit 122, coupled to the MEMS sensor 110, is received at the S/H circuit 124. The S/H circuit 124 allows the SAR 126 to capture the output voltage of the ICMFB circuit 122 during a hold time and the SAR 126 digitizes the voltage output of the ICMFB circuit 122. The timing control circuit 128 provides timing information to the SAR 126. The digital comparator 130 compares the output voltage of the ICFMB circuit 122 to a known reference state (Vnom) of the fault detection system 150. A threshold is set such that if the difference between the voltage at the input node of the digital comparator 130 and Vnom exceeds the threshold, a flag may be set to indicate the presence of a fault condition at the MEMS sensor 110. A component supplier or system manufacturer can thus set a voltage Vnom, that if exceeded, may signify the presence of a fault condition at the MEMS sensor.

It should be appreciated that the ICMFB circuit 122 and the MEMS sensor no are common between the accelerometer system 140 and the fault detection system iso. The operating mode and timing of various switches shared or separate between the two systems may dictate the proper conditions where one or the other is sampled for acceleration or fault detection. In some embodiments, the accelerometer system 140 and the fault detection system 150 are operated at a same time. In these embodiments, the acceleration of the system is measured while monitoring for a possible fault between the ASIC 120 and the MEMS sensor 110.

Furthermore, it should be appreciated that the components in the fault detection system 150 may be readily available in the ASIC 120 or may be added to the ASIC 120 by additional functionality. As an example, the ASIC 120 may already have a SAR unit wherein the resources of the SAR 126 are shared with other systems such as the monitoring of voltage references including VREF, VCM, VROT. In some embodiments, the SAR 126 is monitoring voltages of other components such as a Gyroscope.

FIG. 2 illustrates a schematic diagram of an embodiment of an accelerometer system 200, including a MEMS sensor no coupled to an input common-mode feedback (ICMFB) circuit 122, a differential sense interface 230, various switches, and various nodes with an associated voltage. The differential sense interface 230 is a part of the analog front end circuit described in FIG. 1. In the system, the MEMS sensor 110 interfaces with a first stage switched-capacitor integrator of a sigma-delta converter.

The differential sense interface 230 comprises an operational transconductance amplifier (OTA) 232 and a pair of integration capacitors (Cint). The differential sense interface 230 measures the positional movement of the proof mass in the MEMS sensor no in response to an acceleration. The ICMFB circuit 122 measures the input common-mode of the OTA 232. The feedback capacitors (K1) provide feedback from an output of a sigma-delta modulator (not shown) and are not related to the ICMFB circuit. The digital representation of the output voltage (Vop and Von) from the OTA 232 represent the integral of the sensed acceleration of the MEMS sensor no.

The operation of the accelerometer system 200 may depend on the configuration of various switches in a switch topology to position the circuit in multiple operating modes and cycles. Therefore, in addition to the components above, the accelerometer system 200 includes a number of switches. These additional switches are also used in the fault detection system 150 of FIG. 1 to configure the circuit in one or more operating modes. In the different modes and dependent on the direction of the switches, various nodes of the circuit may be set to different voltages (VREF, VCM, VROT) as illustrated.

The switches swA-swB are running at a different clock rate, as an example 256 KHz, from the switches swC-swF, which as an example, are running at a 64 KHz clock rate or at a maximum rate equivalent to half of the clock rate of swA/swB. The remaining switches are running at a same clock rate of switches swA and swB. The symbols phi1 (Φ1) and phi2 (Φ2), non-overlapping clock pair, each represent a square wave signal running at a 50% duty cycle with a same clock rate of the switches swA and swB. The signal phi1 is reverse of the signal phi2, thus when phi1 is high, phi2 is low and alternatively, when phi1 is low, phi2 is high.

In general, a switched-capacitor circuit may require a two-phase operation: a sampling phase followed by an integrating phase. In a ΣΔ integrating phase, corresponding to a possible acceleration measurement, phi2 is high and the switches displaying the symbol Φ2 are in the close or ON position; alternatively, phi1 is low and the switches displaying the symbol Φ1 are in the open or OFF position.

In a sampling phase, phi1 is high and the switches displaying the symbol Φ1 are in the close or ON position; alternatively, phi2 is low and the switches displaying the symbol Φ2 are in the open or OFF position. In the sampling phase, both STATOR nodes and the ICMFBout are RESET to VROT. The STATOR nodes are RESET to VROT through the intermediary switches coupling the MEMS sensor to the OTA as shown in FIG. 2.

The switches swC and swF are synchronized such that both are either in the ON or OFF condition at a same time. Switches swD and swE are also synchronized such that both are either in the ON or OFF condition at a same time. The switches swC and swF are reverse of swD and swE, such that when swC and swF are ON, swD and swE are OFF; and when swC and swF are OFF, swD and swE are ON.

FIG. 3 illustrates three operational modes of the many possible modes of operation of the accelerometer system 200 in FIG. 2. In the first column from the left, under the SWITCH header, the six switches (swA-swF) are displayed. In the second through fourth columns, under the MODE1-MODE3 headers, the condition of each switch for three operating modes are displayed.

It should be appreciated that the condition of the various switches in their entirety determine the MODE. MODE1 and MODE3 have the same output polarity, accordingly a differential voltage has an equal polarity and value. MODE2 provides opposite polarity to MODE1 and MODE3, therefore the differential voltage in MODE2 has a reverse polarity, but a same value, in comparison to MODE1 and MODE3. For the purposes of illustration in this Application, "ADCsign=0" corresponds to MODE1 and "ADCsign=1" corresponds to either MODE2 or MODE3.

Figure 4:
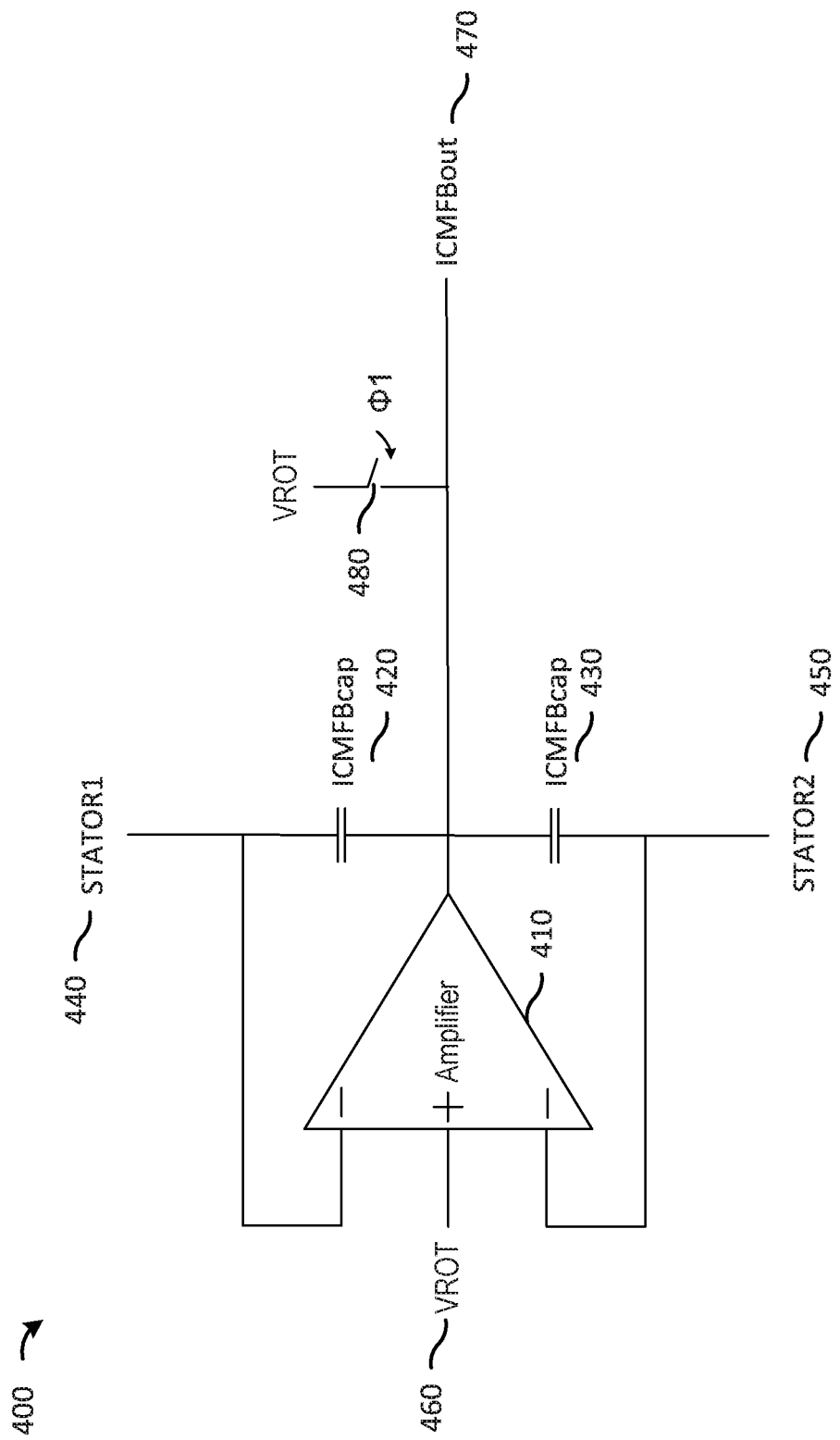
FIG. 4 is diagram of an input common-mode feedback (ICMFB) circuit for detecting functional state of a MEMS sensor.
Figure 5:
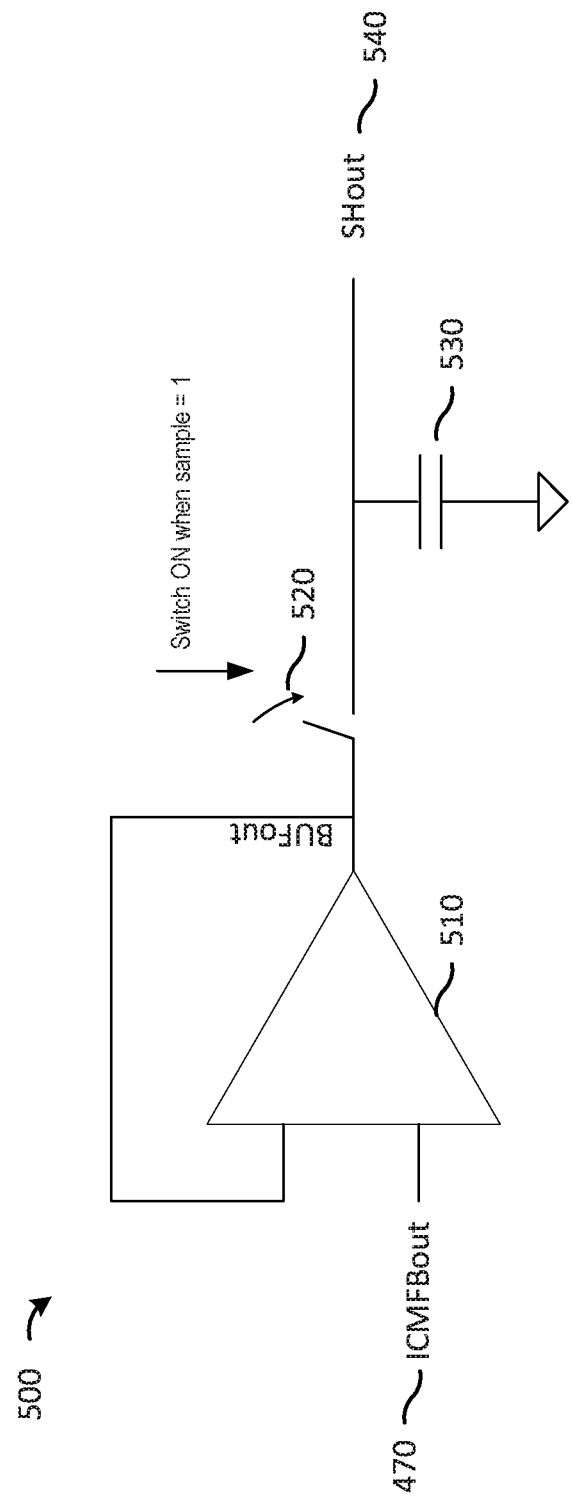
FIG. 5 is a diagram of a sample and hold (S/H) circuit in a system for detecting functional state of a MEMS sensor.

FIG. 4 illustrates a schematic diagram of an embodiment of the ICMFB circuit 400, as an example for the ICMFB circuit 122 in FIG. 2 and the ICMFB circuit 122 in FIG. 1. The ICMFB circuit 400 includes an amplifier 410 and a pair of ICMFBcap capacitors 420. Each ICMFBcap capacitor (420 and 430) is a single-ended output capacitor coupled to the output of the ICMFB circuit 470 and a respective STATOR node (440 and 450) of the MEMS sensor no in FIGS. 1 and 2. As an example, the ICMFBcap capacitor 420 is coupled to STATOR1 and the ICMFBcap capacitor 430 is coupled to STATOR2.

Each of the two inverting input nodes of the amplifier 410 are connected to one of the ICMFBcap capacitors (420 and 430) and a respective STATOR node (440 and 450) of the MEMS accelerometer sensor. The non-inverting node of the amplifier 410 is coupled to the ROTOR node of the MEMS accelerometer sensor with a similarly applied voltage pulse (VROT). The output of the ICMFBout 470 is monitored at the ASIC. A switch 480 is connected to VROT in sync with the phi1 signal as described-above.

The output voltage of the ICMFB circuit can be calculated by the following equation.

$$ICMFBout = \frac{(\pm C0 + 0.5 \times V_{OS}) \times VROT + K1 \times (VCM - 0.5 \times VREF)}{ICMFBcap} + VROT$$

$V_{OS}$ is the differential residue input offset after offset trim with a known target value of zero set at the factory. In a case where the exact target of zero is not achieved, the offset can be determined at the factory. The parameter Co is the common-mode sense capacitance value of the MEMS accelerometer sensor. The parameter K1 is the capacitance of the digital-to-analog converter (DAC) feedback capacitor. The parameter ICMFBcap is the capacitance of the single-ended output capacitor between the MEMS accelerometer sensor STATOR node and the ICMFB output.

As previously discussed, when phi1 is high, both STATOR nodes and the ROTOR node are reset to VROT. In the absence of a forced reset, to maintain proper sensor frontend operation, the STATOR nodes may retain a value of VROT when phi2 is asserted, for example in the ΣΔ integration mode. The voltage of the output ICMFBout 470 of the ICMFB circuit may change accordingly to satisfy this condition through the amplifier 410 feedback circuit As previously mentioned "ADCsign=0" corresponds to MODE1 In this mode, as illustrated in FIG. 3, switch swA is in the ON position when phi1 is high and in the OFF position when phi2 is high. Alternatively, swB is in the ON position when phi2 is high and in the OFF position when phi1 is high. The switches swC and swF are in the ON position and the switches swD and swE are in the OFF position.

The output voltage of the ICMFBout circuit during ΣΔ integration (phi2=high and phi1=low) for "ADCsign=0" mode is given by the following equation.

$$ICMFBout = \frac{(C0 + 0.5 \times V_{OS}) \times VROT + K1 \times (VCM - 0.5 \times VREF)}{ICMFBcap} + VROT$$

In response to a functional disconnect of the MEMS accelerometer sensor, and in the absence of the common-mode sense capacitor (Co), Co can be removed from the above equation. Therefore, the value of ICMFBout voltage may be determined in the absence of Co by replacing nominal values for the remainder of the items in the equation.

As an example, the feedback capacitors K1 may have a nominal value of 117 fF. The ICMFBcap capacitor may have a nominal value of 1,164 fF. The reference voltage VREF may have a nominal value of 1.3V, the voltage VDD may have a nominal value of 2.6V, and the voltage VCM may be equal to half of VDD and therefore have a nominal value of 1.3V.

The output voltage of the ICMFB circuit, in the absence of Co and with $V_{OS}$ assumed to be zero, is represented with the following voltage at room temperature.

$$ICMFBout = \frac{(0 + 0.5 \times 0) \times 1.2 + 117 \times 10^{-15} \times (1.3 - 0.5 \times 1.3)}{1164 \times 10^{-15}} + 1.2 = \cong 1.265V$$

Alternatively, in the presence of the MEMS accelerometer sensor, the capacitance of Co has a known range. If a nominal value within this range is chose, for example 243 fF, the output voltage of the ICMFB circuit in the presence of Co can be represented with the following voltage at room temperature.

$$ICMFBout = $$
$$\frac{(243 \times 10^{-15} + 0.5 \times 0) \times 1.2 + 117 \times 10^{-15} \times (1.3 - 0.5 \times 1.3)}{1164 \times 10^{-15}} + 1.2 \cong$$
$$1.516V$$

The detection of the MEMS sensor relies on the voltage difference at the output of the ICMFB circuit in the presence and absence of the MEMS accelerometer sensor. In the example above, the difference between the two states is 251 mV.

The output voltage of the ICMFB circuit in the presence of the MEMS accelerometer sensor can be determined in a variety of ways, for example it can be measured during assembly and stored in memory. Alternatively, a nominal value for the voltage at the output of the ICMFB circuit can be calculated.

The output voltage of the ICMFB circuit in the absence of the MEMS accelerometer sensor can be measured periodically during the operation of the MEMS accelerometer sensor in the vehicle. The periodic measurement can be compared to the value stored in memory, representing a good state of the MEMS sensor, to indicate a fault at the MEMS sensor.

A similar differential voltage value at the output of the ICMFB circuit in the presence and absence of the MEMS accelerometer sensor can be calculated. If ΔICMFBout is defined to be the difference between ICMFBout (Co=finite) and ICMFBout (Co=0). The removal of common parameters provides the following equation for the differential output voltage of the ICMFB circuit for "ADCsign=0".

$$\Delta ICMFBout = \frac{C0 \times VROT}{ICMFBcap}$$

As an example, with Co having a capacitance in the range of 186 fF to 311 fF, the ICMFBcap having a capacitance of 1,164 fF with a ±10% variation, and VROT set to 1.2V and trimmed to within ±50 mV, the theoretical minimum value of ΔICMFBout for "ADCsign=0" can be calculated to be 167 mV.

A similar value can be calculated for any MEMS sensor since the parameters above are all known values and the individual values to resolve the equation can be determined during manufacturing. Alternatively, the values can be targeted during manufacturing. Moreover, the total value or component values can also be measured and stored in a memory.

In an embodiment, the ASIC periodically monitors the output voltage of the ICMFB circuit. If the ASIC determines that the differential output voltage of the ICMFB circuit has exceeded a threshold value, the system can indicate the presence of a fault condition. Periodically, the ASIC of the MEMS accelerometer may monitor the value of the analog signal during its operation to determine the functional state of the MEMS sensor.

Recalling the previous cases where both STATOR nodes are open or the ROTOR node is open or alternatively the ROTOR node is shorted in the circuit; the ASIC may detect an anomaly by monitoring the output voltage of the ICMFB circuit. Therefore, even if the ASIC outputs a digital representation of a possible acceleration value (i.e., o-g), the ASIC may determine and flag a disconnect at the MEMS accelerometer sensor.

In an embodiment, the value of the differential voltage ΔICMFBout may be doubled to improve the reliability of detection of a disconnect. As an alternative to the above and as previously mentioned, "ADCsign=1" corresponds to either MODE2 or MODE3. In this mode, as illustrated in FIG. 3, switch swA is in the ON position when phi2 is high and in the OFF position when phi1 is high. Alternatively, swB is in the ON position when phi1 is high and in the OFF position when phi2 is high. The switches swC and swF are in the ON position and the switches swD and swE are in the OFF position in MODE2. The switches swC and swF are in the OFF position and the switches swD and swE are in the ON position in MODE3.

In "ADCsign=1" the switches at the ROTOR node of the MEMS accelerometer sensor (swA and swB) are in reverse of "ADCsign=0." Therefore, in "ADCsign=0" the VROT pulse to the ROTOR pin is applied when phi1 is high and phi2 is low. Alternatively, in "ADCsign=1" the VROT pulse to the ROTOR pin is applied when phi2 is high and phi1 is low.

The output voltage of the ICMFB circuit during ΣΔ integration (phi2=high and phi1=low) for "ADCsign=1" mode is given by the following equation.

$$ICMFBout = $$
$$\frac{(-C0 + 0.5 \times V_{OS}) \times VROT + K1 \times (VCM - 0.5 \times VREF)}{ICMFBcap} + VROT$$

The output voltage of the ICMFB circuit in the absence of the MEMS accelerometer sensor in "ADCsign=1" behaves similarly to "ADCsign=0."

The differential voltage ΔICMFBout, which is the difference between the output voltage of the ICMFB circuit in the presence and absence of the common-mode sense capacitance of the MEMS accelerometer sensor, can be calculated with the following equation.

$$\Delta ICMFBout = \frac{-C0 \times VROT}{ICMFBcap}$$

As an example, with Co having a capacitance in the range of 186 fF to 311 fF, the ICMFBcap having a capacitance of 1,164 fF with a ±10% variation, and VROT set to 1.2V and trimmed to within ±50 mV, the theoretical minimum value of ΔICMFBout for "ADCsign=1" can be calculated to be −167 mV.

In an embodiment, the differential voltage ΔICMFBout is computed in alternate cycles at "ADCsign=0" and "ADCsign=1." In the presence of the MEMS accelerometer sensor, the differential voltage ΔICMFBout is computed and stored in a memory. In the absence of the MEMS accelerometer sensor the reliability of detection is improved by effectively doubling a value that is being monitored to flag the functional state of the MEMS accelerometer sensor.

FIG. 5 illustrates the sample and hold (S/H) circuit 500 as illustrated in element 124 of FIG. 1. The S/H circuit 500 samples the varying analog output voltage ICMFBout 470 of the ICMFB circuit 400 at a specific time and holds the value at a constant level. The S/H circuit 124 includes a buffer amplifier 510, for example, an operational amplifier, that receives the ICMFBout voltage 470 and supplies minimal gain. In sample mode, the switch 520—for example a MOSFET switch—is closed or ON, the output voltage (BUFout) of the input amplifier 510 follows the input ICMFBout voltage 470 with a small offset as an analog SHout voltage 540. Additionally, the hold capacitor 530 stores the BUFout voltage charge. In hold mode, the switch 520 is opened, and the hold capacitor 520 holds the previously-stored charged voltage as the analog voltage SHout 540 to the input of the SAR 126. The timing of the operation of the switch 520 is controlled by the ASIC 120.

In accordance with embodiment methods described herein, the ICMFBout 470 of the ICMFB circuit 400 is sampled when phi2 is high at a cycle of "ADCsign=0" and separately at a cycle of "ADCsign=1." The difference ($\Delta V_{ADCsign}$) between the two output voltages [ICMFBout(ADCsign=0) and –ICMFBout(ADCsign=1)] of the ICMFB circuit at the two cycles is captured at the SAR during the hold time. This measurement can be performed at manufacturing and stored in memory as a reference voltage corresponding to the presence of the MEMS accelerometer sensor.

$$\Delta V_{ADCsign} = \text{ICMFBout}(\text{ADCsign}=0) - \text{ICMFBout}(\text{ADCsign}=1)$$

Periodically in the field, the differential voltage $\Delta V_{ADCsign}$ can be measured under the same operating conditions and cycles. If the differential voltage measured in the field when compared to the reference voltage, corresponding to the presence of the MEMS accelerometer sensor, is greater than a threshold value, the ASIC can determine a fault at the MEMS accelerometer sensor.

Figure 6:
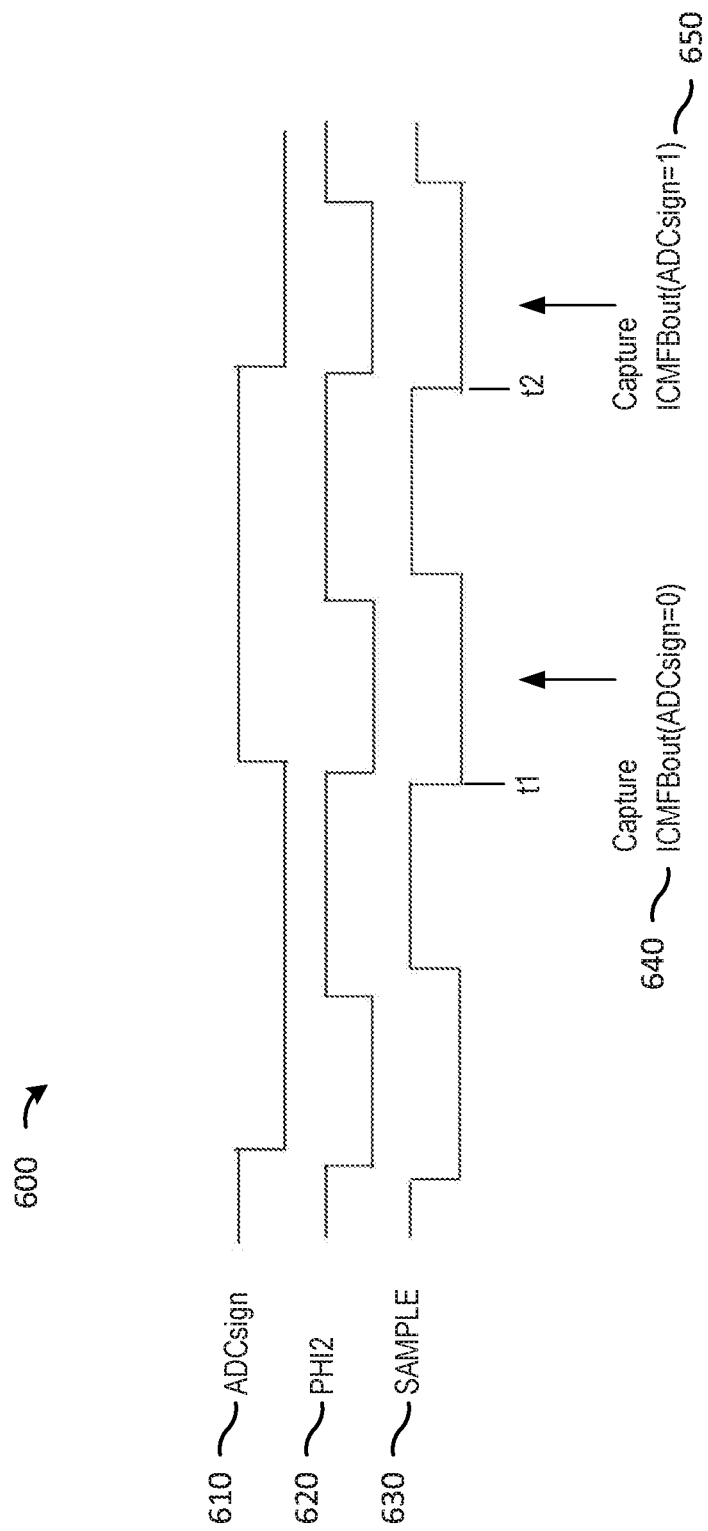
FIG. 6 is a signal timing diagram of a S/H circuit in a system for detecting state of a MEMS sensor.

FIG. 6 illustrates a timing diagram of an embodiment 600 as an example of the operational flow of a S/H circuit 500 as illustrated in FIG. 5. The timing diagram of the ADCsign signal 610 illustrates that the value of ADCsign is equally alternating between a high value "ADCsign=1" and a low value "ADCsign=0." In each cycle of the ADCsign signal 610, the signal phi2 620 is also alternating between a high (phi2=1) and low value (phi2=0).

The output voltage of the ICMFB circuit 122 for "ADCsign=0" 640 has a valid value when the ADCsign signal 610 is low and phi2 is high (phi2=1). In sample mode, the sample signal 630 of the S/H circuit 500 is set to high (sample=1) to capture the output voltage ICMFBout(ADCsign=0) 640. At time t1, the S/H circuit 500 is placed in hold mode (sample=0) and the output of the S/H circuit 500 may be captured during the entire hold interval corresponding to the output voltage ICMFBout(ADCsign=0) 640.

Alternatively, the output voltage of the ICMFB circuit 122 for "ADCsign=1" 650 has a valid value when the ADCsign signal 610 is high and phi2 is high (phi2=1). In sample mode, the sample signal 630 of the S/H circuit 500 is set to high (sample=1) to capture the output voltage ICMFBout(ADCsign=1) 650. At time t2, the S/H circuit 500 is placed in hold mode (sample=0) and the output of the S/H circuit 500 may be captured during the entire hold interval corresponding to the output voltage ICMFBout(ADCsign=1) 650.

At a time when the phi2 signal is high (phi2=1), the analog signal is in settling mode. The sampling near the transition of phi2 from high to low (t1 and t2) allows adequate settling time prior to sampling of the output voltage. At the transition of the S/H circuit 500 from sample (sample=1) to hold (sample=0), a glitch may occur during a narrow time band. Therefore, a cleaner signal may be captured during the hold time (sample=0).

As described above, the differential of the two captured voltages ICMFBout(ADCsign=0) 640 and ICMFBout (ADCsign=1) 650 is equal to the differential voltage $\Delta V_{ADCsign}$.

Although the embodiments of the disclosure mostly utilize a digital representation of the output voltage of the ICMFB circuit 122, it should be understood that a representative circuit with analog components may achieve similar results.

Example embodiments of the present invention are summarized here. Other embodiments can also be understood from the entirety of the specification and the claims filed herein.

Example 1

A method for detecting functional state of a microelectromechanical (MEMS) sensor includes monitoring an input common-mode feedback (ICMFB) voltage generated by an ICMFB circuit coupled to the MEMS sensor through a plurality of nodes. The method further includes determining, using the monitored ICMFB voltage, whether all of the plurality of nodes of the MEMS sensor are electrically connected to the ICMFB circuit.

Example 2

The method of example 1, where determining whether all of the plurality of nodes are electrically connected includes computing a differential voltage corresponding to a difference between the monitored ICMFB voltage and a predetermined voltage measured at an output of the ICMFB circuit during a normal operation of the MEMS sensor and determining the functional state of the MEMS sensor in accordance with the differential voltage.

Example 3

The method of examples 1 and 2, where determining whether all of the plurality of nodes are electrically connected, further includes reading the predetermined voltage stored in a memory prior to computing the differential voltage.

Example 4

The method of examples 1 and 2, where determining the functional state of the MEMS sensor in accordance with the differential voltage further includes comparing the differential voltage to a threshold voltage.

Example 5

The method of example 1, further includes measuring a minimum voltage corresponding to a minimum value of a capacitor in the ICMFB circuit, a pulse voltage applied to the ICMFB circuit and the MEMS sensor, and a common-mode capacitance of the MEMS sensor stored in a memory.

Example 6

The method of examples 1 and 5, further includes determining a differential voltage corresponding to a difference between the minimum voltage and a predetermined voltage measured during a normal operation of the MEMS sensor, where the predetermined voltage measured during a normal operation of the MEMS sensor is stored in a memory.

Example 7

The method of example 1, where monitoring the ICMFB voltage further includes operating the ICMFB circuit in a first operating mode, measuring a first ICMFB voltage generated by the ICMFB circuit in the first operating mode, operating the ICMFB circuit in a second operating mode, where the second operating mode is a reverse input polarity mode of the first operating mode, and measuring a second ICMFB voltage generated by the ICMFB circuit in the second operating mode.

Example 8

The method of examples 1 and 7, where determining whether all of the plurality of nodes are electrically connected includes computing a first differential voltage corresponding to a difference between the first ICMFB voltage and the second ICMFB voltage, computing a second differential voltage corresponding to a difference between the first differential voltage and a predetermined voltage measured at an output of the ICMFB circuit during a normal operation of the MEMS sensor, and determining the functional state of the MEMS sensor in accordance with the second differential voltage.

Example 9

The method of example 1, where monitoring the ICMFB voltage further includes operating the ICMFB circuit in a first operating mode, measuring a first ICMFB voltage generated by the ICMFB circuit in the first operating mode, operating the ICMFB circuit in a second operating mode, wherein the second operating mode is a reverse cycle of the first operating mode, and measuring a second ICMFB voltage generated by the ICMFB circuit in the second operating mode.

Example 10

The method of examples 1 and 9, where determining whether all of the plurality of nodes are electrically connected further includes computing a predetermined differential voltage corresponding to a difference between the first ICMFB voltage and the second ICMFB voltage during a hold time of a sample and hold (S/H) circuit and during a normal operation of the MEMS sensor, and storing the predetermined differential voltage in a memory.

Example 11

The method of examples 1, 9, and 10, where determining whether all of the plurality of nodes are electrically connected includes computing a first differential voltage corresponding to a difference between the first ICMFB voltage and the second ICMFB voltage during a hold time of a sample and hold (S/H) circuit.

Example 12

The method of examples 1, 9, 10, and 11, further includes computing a second differential voltage corresponding to a difference between the first differential voltage and the predetermined differential voltage, and determining the functional state of the MEMS sensor in accordance with the second differential voltage.

Example 13

A circuit including an application specific integrated circuit (ASIC) comprising an input common-mode feedback (ICMFB) circuit coupled to a MEMS sensor, wherein the ASIC is configured to determine functional state of the MEMS sensor corresponding to an output voltage of the ICMFB circuit.

Example 14

The circuit of example 13, where the ASIC is further configured to monitor the output voltage of the ICMFB circuit.

Example 15

The circuit of example 14, where the ASIC is further configured to compute a differential voltage corresponding to a difference between the monitored ICMFB voltage and a predetermined voltage measured at an output of the ICMFB circuit during a normal operation of the MEMS sensor, and determine the functional state of the MEMS sensor in accordance with the differential voltage.

Example 16

The circuit of examples 13, 14, and 15, where the ASIC is further configured to compare the differential voltage to a threshold voltage to determine functional state of the MEMS sensor corresponding to an output voltage of the ICMFB circuit.

Example 17

A device including a microelectromechanical system (MEMS) sensor; and an application specific integrated circuit (ASIC) including an input common-mode feedback (ICMFB) circuit coupled to the MEMS sensor, where the ASIC is configured to determine functional state of the MEMS sensor corresponding to an output voltage of the ICMFB circuit.

Example 18

The device of example 17, where the ASIC is further configured to monitor the output voltage of the ICMFB circuit, compute a differential voltage corresponding to a difference between the monitored ICMFB voltage and a predetermined voltage measured at an output of the ICMFB circuit during a normal operation of the MEMS sensor, and determine the functional state of the MEMS sensor in accordance with the differential voltage.

Example 19

The device of examples 17 and 18, where the ASIC is further configured to compare the differential voltage to a threshold voltage to determine functional state of the MEMS sensor corresponding to an output voltage of the ICMFB circuit.

Example 20

The device of example claim 17, where the ASIC is further configured to measure a minimum voltage corresponding to a minimum value of a capacitor in the ICMFB circuit, a pulse voltage applied to the ICMFB circuit and the MEMS sensor, and a common-mode capacitance of the MEMS sensor stored in a memory.

Example 21

The device of example 17, where the ASIC is further configured to operate the ICMFB circuit in a first operating mode, measure a first ICMFB voltage generated by the ICMFB circuit in the first operating mode, operate the ICMFB circuit in a second operating mode, wherein the second operating mode is a reverse input polarity mode of the first operating mode, and measure a second ICMFB voltage generated by the ICMFB circuit in the second operating mode.

Example 22

The device of examples 17 and 21, where the ASIC is further configured to compute a first differential voltage corresponding to a difference between the first ICMFB voltage and the second ICMFB voltage, compute a second differential voltage corresponding to a difference between the first differential voltage and a predetermined voltage measured at an output of the ICMFB circuit during a normal operation of the MEMS sensor, and determine the functional state of the MEMS sensor in accordance with the second differential voltage.

Example 23

The device of example 17, where the ASIC is further configured to operate the ICMFB circuit in a first operating mode, measure a first ICMFB voltage generated by the ICMFB circuit in the first operating mode, operate the ICMFB circuit in a second operating mode, wherein the second operating mode is a reverse cycle of the first operating mode, and measure a second ICMFB voltage generated by the ICMFB circuit in the second operating mode.

Example 24

The device of examples 17 and 23, where the ASIC is further configured to compute a predetermined differential voltage corresponding to a difference between the first ICMFB voltage and the second ICMFB voltage during a hold time of a sample and hold (S/H) circuit and during a normal operation of the MEMS sensor, store the predetermined differential voltage in a memory, compute a first differential voltage corresponding to a difference between the first ICMFB voltage and the second ICMFB voltage during a hold time of a sample and hold (S/H) circuit, and compute a second differential voltage corresponding to a difference between the first differential voltage and the predetermined differential voltage, and determine the functional state of the MEMS sensor in accordance with the second differential voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    monitoring an input common-mode feedback (ICMFB) voltage generated by an ICMFB circuit, the ICMFB coupled to a microelectromechanical system (MEMS) sensor through a plurality of nodes, the monitoring comprising:
    measuring, by a sample and hold (S/H) circuit, a first ICMFB voltage generated by the ICMFB circuit operating in a first operating mode, and
    measuring, by the S/H circuit, a second ICMFB voltage generated by the ICMFB circuit in a second operating mode;
    computing a first differential voltage corresponding to a difference between the first ICMFB voltage and the second ICMFB voltage;
    computing a second differential voltage corresponding to a difference between the first differential voltage and a predetermined voltage measured; and
    determining whether all of the plurality of nodes is electrically connected to the ICMFB circuit in accordance with the second differential voltage.

2. The method of claim 1, further comprising reading the predetermined voltage stored in a memory before computing the second differential voltage.

3. The method of claim 1, wherein the determining whether all of the plurality of nodes is electrically connected comprises computing a third differential voltage corresponding to a difference between the second differential voltage and a threshold voltage.

4. The method of claim 1, further comprising measuring a minimum voltage corresponding to a minimum value of the first differential voltage.

5. The method of claim 4, further comprising determining whether all of the plurality of nodes is electrically connected based on a comparison between the minimum voltage and a threshold value stored in a memory.

6. The method of claim 1, wherein the second operating mode is a reverse input polarity mode of the first operating mode.

7. The method of claim 1, further comprising storing the differential voltage in a memory.

8. The method of claim 1, wherein the ICMFB circuit comprises a first terminal and a second terminal, wherein the MEMS sensor comprises a first terminal and a second terminal, the method further comprising:
    providing the first operating mode corresponding to the first terminal of the MEMS sensor coupled to the first terminal of the ICMFB circuit and the second terminal of the MEMS sensor coupled to the second terminal of the ICMFB circuit; and
    providing the second operating mode corresponding to the first terminal of the MEMS sensor coupled to the second terminal of the ICMFB circuit and the second terminal of the MEMS sensor coupled to the first terminal of the ICMFB circuit, the second operating mode being a reverse input polarity mode of the first operating mode.

9. The method of claim 1, wherein the MEMS sensor is coupled to a differential sense interface.

* * * * *